United States Patent
Spratt et al.

(10) Patent No.: US 6,476,597 B1
(45) Date of Patent: Nov. 5, 2002

(54) IONIZING DOSE HARDNESS ASSURANCE TECHNIQUE FOR CMOS INTEGRATED CIRCUITS

(75) Inventors: James P Spratt, Carlsbad; Roland E. Leadon, Solana Beach, both of CA (US)

(73) Assignee: Full Circle Research, Inc., San Marcos, CA (US)

(*) Notice: Subject to any disclaimer, the term of this patent is extended or adjusted under 35 U.S.C. 154(b) by 0 days.

(21) Appl. No.: 09/483,893

(22) Filed: Jan. 18, 2000

(51) Int. Cl.[7] .............................................. G01R 31/26
(52) U.S. Cl. ..................................... 324/158.1; 324/765
(58) Field of Search ............................... 324/501, 158.1, 324/765; 250/492.2; 438/308, 378, 795, 796, 798, 953

(56) References Cited

U.S. PATENT DOCUMENTS

| | | | | |
|---|---|---|---|---|
| 3,769,693 A | * | 11/1973 | Cates et al. | 438/17 |
| 4,168,432 A | * | 9/1979 | Williams et al. | 250/307 |
| 4,220,918 A | * | 9/1980 | Pepper | 324/765 |
| 4,816,753 A | * | 3/1989 | Palkuti | 324/501 |

* cited by examiner

*Primary Examiner*—Michael J. Sherry
*Assistant Examiner*—Minh N. Tang
(74) *Attorney, Agent, or Firm*—Robert R. Meads

(57) ABSTRACT

A method for testing IC devices for radiation hardness in a non-destructive manner, comprising subjecting a device under test (DUT) originally in an insensitized state, to a state in which the DUT is more sensitive to adverse effects of ionizing dose radiation and while the DUT is in the more sensitive state, subjecting the DUT to a low level of ionizing radiation to degrade performance of the DUT and electrical testing followed by a restoration of the DUT to its original insensitized state.

8 Claims, 12 Drawing Sheets

IONIZING DOSE HARDNESS ASSURANCE TECHNIQUE FOR CMOS INTEGRATED CIRCUITS

1.0 FIELD OF INVENTION

The present invention relates to testing procedures that can be used to determine the sensitivity of integrated circuits to ionizing doses of radiation in advance of their actual exposure to radiation of the type and intensity to which they will be exposed in their intended application. More particularly, it relates to a scheme for pre-irradiating silicon integrated circuits at low levels and determining their sensitivity to future radiation exposure at much higher levels. Furthermore, the adverse effects of the low level exposure can then be easily removed, leaving almost no permanent damage. Consequently, the procedure of the present invention is a non-destructive method of performing 100% screening of integrated circuits for ionizing dose sensitivity.

2.0 BACKGROUND OF INVENTION

Many military and commercial electronic systems may be exposed to nuclear radiation. Military systems would have to withstand such exposure during nuclear warfare, while commercial space systems will experience this exposure if they operate in natural space radiation. This forces designers of such systems to harden them against the adverse effects of radiation exposure.

2.1 TECHNICAL DISCUSSION

It has been shown that the elements of electronic systems that are most sensitive to radiation are integrated circuits (ICs). Consequently, there is great interest in methods for determining the radiation hardness of the ICs to be used in such applications, and assuring that the hardness level, once determined, is maintained during system production and deployment.

2.1.1 Integrated Circuit Technology

The most widely used integrated circuit technology in the world today is one known as CMOS (complementary metal-oxide semiconductor) technology. The most widely used products using CMOS are digital devices, such as memory chips, microprocessors, etc.. Therefore, the following description of the present invention will address digital CMOS ICs, even though the general approach can also be used for CMOS integrated circuits other than digital CMOS ICs.

CMOS technology gets its name from the fact that P-channel Metal-Oxide-Silicon (MOS) transistors and N-channel MOS transistors are used in series in various combinations to implement logic functions. Since, in operation, one of these transistors is turned OFF while the other is turned ON, circuits implemented in such an arrangement dissipate little power, except when they are changing state. This makes this technology interesting in many applications where low power dissipation is important.

FIG. 1 shows a cross sectional view of the PMOS and NMOS transistors that are used in CMOS ICs, with the gate oxide (usually fabricated with $SiO_2$) labeled as such, and the field oxide identified as the $SiO_2$ region. FIG. 2 is a circuit schematic showing how such transistors would be used in the simplest CMOS circuit, an inverter. (Output buffers, commonly used on digital CMOS ICs, use this circuit configuration.) The PMOS device is shown as Q2 in this diagram, and the NMOS device is shown as Q1.

A critical parameter of both N-channel and P-channel MOS transistors is the threshold voltage, VT. This is the value of the gate voltage at which significant current begins to flow from the source to the drain. This parameter is the single most important quantity in CMOS integrated circuit technology. It is significantly affected by exposure to ionizing radiation, and therefore is important to the understanding to radiation damage effects in CMOS ICs, and to an appreciation of the object of this patent.

2.1.1.1 Ionizing Radiation Damage in Digital CMOS ICs

Ionizing radiation degrades digital CMOS ICs by (1) causing changes in the threshold voltage ($V_{TN}$) of N-channel MOS transistors, decreasing it under some circumstances, and increasing it under others, by (2) causing increases in the threshold voltage of P-channel MOS transistors ($V_{TP}$), and (3) by causing increases in the ON-resistance ($R_{ON}$) of both types of devices. Decreases in $V_{TN}$ can lead to increases in operating current and/or inability to switch. Increases in $V_{TN}$ and $V_{TP}$ can cause reductions in the speed of operation of a circuit and loss of circuit functionality. Increases in device ON-resistance can lead to inability to drive other circuits, either on-chip or off-chip, with resultant loss of functionality.

The part of a CMOS transistor most sensitive to ionizing radiation is the oxide layer, either the gate oxide or the field oxide. When ionizing radiation impinges on an oxide, the energy deposited creates electron/hole pairs. The electrons (conventionally denoted 'n') are more mobile than the holes (denoted 'h'), and are swept out of the oxides in times of the order of a picosecond. In that time, however, some fraction of the electrons and holes recombine. This fraction depends on the applied electrical field and the energy and kind of the radiation, and is small for normal operating conditions.

FIG. 3 shows the processes involved in radiation damage to CMOS ICs, starting with the generation of electron/hole pairs by radiation, the transport of holes through localized states in $SiO_2$ bulk, the trapping of some of these holes near the $Si/SiO_2$ interface and the formation of traps at this interface. The first three of these steps are well understood, but the formation of interface traps remains incompletely understood.

Digital CMOS ICs exhibit radiation-induced failure mechanisms attributable to either positive charge liberated by the radiation and trapped in oxide layers, or to negatively charged traps at the silicon dioxide/silicon interface. The former effect is responsible for the decrease in $V_{TN}$ and the increase in $V_{TP}$ cited above, and for an increase in ON-resistance of both types of devices. The latter is responsible for increases in $V_{TN}$ and $V_{TP}$ and also for increases in the ON-resistance of both types of devices.

Process (1) in FIG. 3 illustrates the generation of electron/hole pairs by ionizing radiation. This process, and the initial recombination that accompanies it, determines the yield of radiation generated holes. This process is well understood, and the yield of charge carriers generated by radiation can be calculated once the rate at which the incident particles lose energy is specified.

Process (2) in FIG. 3 illustrates the dispersive, hopping transport of holes from their point of creation to the vicinity of the $Si/SiO_2$ interface. The transport of radiation-generated holes through oxides usually takes place under an electrical bias field, and it takes place via "small polarons". "Small polaron" transport is a temperature-activated process at temperatures above about 160° K, and is not temperature-activated below 160° K. At temperatures below this transition point, holes are 'self-trapped' at their point of creation, while at higher temperatures, they travel toward the silicon (for positive gate bias).

Process (3) in FIG. 3 illustrates the trapping of holes near the $Si/SiO_2$ interface. Mobile holes eventually encounter a distribution of hole traps that starts at the $Si/SiO_2$ interface and extend a few nano-meters into the oxide. Depending on the local density, $N_{ht}$, and hole capture cross section, $\sigma_{ht}$, of these traps, a fraction $f_T$ of the holes will be captured. Hole trapping fractions are usually much less than one, so most of the holes drift out of the oxide into the silicon at normal temperatures, and do not contribute to degradation of the electrical properties of devices. Even though $f_T$ is usually <<1, it can still vary considerably from one device to another. In fact, the magnitude of the hole trapping fraction, $f_T$ is a parameter that differentiates "hard" oxides from "soft" oxides, with the former usually having $f_T$ values of <1%, while the latter can have $f_T$ values of ≈10%. As a result, most holes generated by radiation do not contribute to electrical degradation at room temperature.

Process (4) in FIG. 3 shows the formation of interface states. The mechanism(s) whereby interface traps are created in CMOS devices by ionizing radiation remains controversial despite many years of research. Models to describe the process fall into two main groups. One group contends that some of the trapped positive charges near the $Si/SiO_2$ interface convert to negatively-charged interface traps by various mechanisms. The other group contends that some of the holes created in the oxide by radiation react in the oxide to produce positively charged ions, probably H+. These ions then slowly drift under positive gate bias to the $Si/SiO_2$ interface where they react with Si-H bonds to form molecular $H_2$ and dangling Si bonds, which are the interface traps.

2.1.1.2 Failure Modes in Irradiated CMOS ICs

As a result of the physical changes that ionizing radiation causes in CMOS ICs, a range of failure modes and mechanisms are observed in irradiated devices. These changes are most easily observed in those elements of the IC that are located at inputs or outputs. Radiation-induced changes in input or output elements which prevent the IC from supplying the specified output drive current levels for digital high and/or digital low output levels, or prevent it from achieving the proper output waveform rise and fall times, or prevent it from meeting specified leakage current specifications, etc., are called parametric failures, and are the most commonly seen radiation-induced failures. Parametric testing is performed to detect radiation-induced parametric failures affecting an MOS transistor at the input or output of an IC.

Some IC designs, however, demonstrate greater sensitivity to radiation damage on the part of interior elements than on the part of elements located at inputs or outputs. When this occurs, changes in current drive capability or leakage of interior elements will cause the IC to fail functionally. In such cases, the IC will cease to perform the function for which it was designed, or will begin to perform this function incorrectly (generate digital errors), even though the input/output characteristics are still within specification limits. Functional testing of ICs attempts to detect radiation-induced faults affecting the logic function of the chip (functional failures). In its simplest form, it consists of functional verification, i.e. verifying that the chip "does what it'supposed to do". A well defined digital input signal (called an input vector) is applied to the chip and the output signal produced in response to the input signal is compared to the value from a known-good part for the same input data. Functional testing verifies that the device is capable of performing the function for which it was designed, e.g. digital multipliers are functionally tested by verifying that they perform the multiplier function, microprocessors can be functionally tested by performing built-in self test [BIST] routines that are often supplied with these devices, which exercise many of the on-chip functions required of microprocessors. Functional failures occur when the output produced by an irradiated chip differs from that produced by an "ideal" chip.

To categorize these effects, researchers have developed four classifications of radiation-induced failures. Table 1 shows these categories, the rates at which the dose is delivered, the failure mechanisms they exhibit for these dose rates, and the cause of these failure mechanisms.

TABLE 1

CLASSIFICATION OF RAD-INDUCED FAILURES

| Characteristics | Categories | |
|---|---|---|
| | I | II |
| Radiation dose rate | High (>1 rad/sec) | Low (≦1 rad/sec) |
| Failure mechanism | Leakage increase, loss of drive, or functional failure | Loss of high speed functionality or drive capability |
| Cause of failure | Oxide trapped charge | Interface trap buildup |

2.1.1.3 Radiation Hardened CMOS ICs

Over the last few decades, many ICs have been designed and built to be "radiation hardened" devices. An entire technology has been developed for this purpose, using special design and processing procedures which assure that the resultant product meets the requirements of the system for which it is intended. The special design techniques used include such procedures as making elemental portions of the IC larger than they would otherwise be in order to reduce the probability of radiation-induced interactions between adjacent components. While improving hardness, this can also mean that the number of components fabricated on a chip of a given size is reduced, reducing performance and increasing chip costs. The special processing procedures used include such steps as reducing the temperature at which critical steps are carried out to avoid the adverse effect that high temperature processing has been found to have on the radiation hardness of ICs. This can mean that radiation hardened chips must be fabricated on special production lines, rather than the lines used to fabricate devices intended for use in commercial applications, where radiation hardness is not an issue. This also increases the cost of radiation hardened ICs and makes it more difficult for the designers of radiation hardened systems to take advantage of the many ICs available in the commercial world.

2.1.1.4 Radiation Hardness Assurance

Radiation Hardness Assurance (RHA, or HA) is an aspect of Quality control that addresses the procedures used to control the variability in radiation hardness of ICs. RHA (or HA) attempts to assure that semiconductor devices retain the radiation hardness attributed to them as a result of characterization testing.

Several factors can cause semiconductors to have ionizing dose hardness less than that of supposedly identical devices. To understand these factors, it is necessary to understand the processes used to design and manufacture ICs. CMOS integrated circuits are processed one lot at a time, making IC production a "batch" process. The finished product is identified by the electrical function it performs and by the input and output (I/O) parameters it exhibits. The ability of an IC to tolerate exposure to ionizing radiation has been shown to depend on the details of the process steps used and on the layout of and the interrelationship between the constituent circuit elements.

Radiation hardened ICs are manufactured with tightly controlled (baselined) processes. "Baselining" a semiconductor process means that, once the radiation hardness of an IC is determined, the manufacturer agrees not to change the product or process in any significant way without first evaluating the impact of such a change. Consequently, all devices manufactured on a fabrication line producing "radiation hardened" ICs are found to be similar in radiation performance and thus constitute a statistically homogeneous population. The radiation hardness of individual integrated circuits then can be presumed (as in the case of a "Qualified Manufacturing Line, or "QML") or determined by standard statistical methods, such as "sample testing". Sample testing consists of drawing a sample of devices from a statistically homogeneous population of devices, exposing them to the environment of interest, and inferring the future performance of all members of the population from the known performance of the sample. While QML lines are preferred, since they "design in" radiation hardness, sample testing is still done on product from some lines to verify continued radiation hardness.

FIG. 4 shows a method currently favored for screening parts from a statistically homogeneous population for ionizing dose hardness, using sample testing. It is intended to provide a conservative estimate of the hardness of CMOS ICs. The main flow of the test consists of two parts. The first part, labeled "I", consists of an irradiation to the total dose specification, D, at a dose rate of $R_o$, where $R_o$ is between 50 and 300 rad (Si)/sec. Electrical test follows, within two hours of the irradiation. The second part, labeled "II", consists of a second irradiation to an additional level equal to 50% of the initial dose, D, followed by a 168 hour anneal at 100° C. under bias, and a second electrical test.

While using radiation hardened CMOS devices relieves systems designers of concerns about Radiation Hardness Assurance, they (systems designers) are increasingly unwilling to pay the price associated with the special procedures required to build radiation-hardened integrated circuits. Consequently, interest has grown in the development of techniques for using conventional commercial ICs in applications where exposure to nuclear radiation is a concern. Such a switch in strategy poses numerous problems, however. These problems arise because commercial suppliers of ICs are structured to supply commodity parts at a low price. They produce in large quantities, and are reluctant to change their procedures, even in a minor way, for customers who only want to buy what they consider to be a few parts. (The total radiation-hardened semiconductor business is only about 0.5% of the world-wide semiconductor business.) In particular, they will often be unable or unwilling to maintain wafer lot identity. Since ionizing dose hardness is known to vary from wafer to wafer and from lot to lot, loss of wafer lot identity would call into question the assumption that the parts are all from a statistically homogeneous population, and would invalidate Hardness Assurance techniques based on radiation-testing sample devices from a lot. Consequently, new techniques are needed to provide assurance of the ionizing dose hardness of ICs, if commercial ICs are to be used in critical systems.

In this regard, testing has shown that some commercial ICs have sufficient hardness for use in some military and space applications, but others, nominally identical, do not. Unfortunately, the variability in ionizing dose hardness of commercial ICs is significantly greater than that of radiation-hardened ICs. Further, as indicated, conventional statistical sampling techniques are inapplicable, due to the inability to assure that the sample is drawn from a statistically homogeneous population. Thus, commercial IC production lines are not expected to meet QML requirements for radiation hardness. In particular, commercial ICs differ from QML ICs in several ways, some of which are process-related, and some of which are product-related. Manufacturers of radiation hardened QML ICs identify and control those features of the process that are critical to radiation hardness. However, such features often do not affect electrical performance or reliability, so commercial manufacturers do not control them to the degree needed to maintain ionizing dose hardness. Consequently, the radiation hardness of commercial ICs can vary, even when produced by lines using Statistical Process Control techniques that are quite adequate for meeting commercial product requirements.

In addition to process variabilities, product design and/or chip layout changes can affect ionizing dose hardness. One type of change that occurs often in the commercial IC world is what is called a "die shrink", i.e. a reduction in the size of a chip by implementing changes in design rules permitting manufacturers to realize more chips per wafer, thereby increasing revenues. Such changes occur on the average of every 18 months in memory and processor standard products, and less frequently for analog products. In these cases, circuit function is unchanged, but parasitic structures important to radiation hardness may change in unknown ways. Because of the impact such process, product, and/or layout changes can have on ionizing dose hardness, and the inability to use baselining, QML and/or sample testing, other approaches to Hardness Assurance (HA) are necessary to control the variability in ionizing dose hardness of commercial ICs. Few alternatives are available. One alternative is 100% screening using irradiation and anneal.

2.1.1.4.1 Irradiate and Anneal as a Hardness Assurance Technique

Irradiate and anneal (IRAN) is a Hardness Assurance technique in which each IC is irradiated to a low level, the electrical effect of such radiation exposure observed, and the behavior of the IC at a high level of radiation predicted from its response at the low level radiation. Early researchers attempted to develop this technique to detect devices that are more sensitive to ionizing radiation than the rest of the population being studied. It was intended that the damage inflicted in the process be removed by annealing. Devices were irradiated to a suitable dose under representative bias conditions at room temperature. Specified parameters were monitored and the more sensitive parts separated from the harder parts by means of a predetermined acceptance limit. The acceptable devices were then supposedly restored to their pre-irradiation condition by annealing them at an elevated temperature, making what would otherwise be a destructive test into a non-destructive test.

Early efforts to use IRAN failed because the damage introduced by the pre-irradiation could not be removed by annealing. In particular, when irradiations are carried out at room temperature, positive charge is trapped in the oxides. Interface traps are also formed. Trapped positive charge and interface traps produce different effects and anneal at different rates and different temperatures. Further, it is more difficult to anneal away the interface traps at reasonable temperatures. Thus, when digital CMOS ICs are pre-irradiated at room temperature and then annealed, oxide trapped charge, $N_{ot}$, and interface trapped charge, $N_{it}$ do not anneal at equal rates. This prevents successive irradiate-and-anneal cycles from tracking, making the process highly suspect, and preventing the use of this approach as a 100% screen. While the concept is still very interesting, and would be valuable if it could be perfected, pre-irradiating parts at room temperature did not work. Accordingly, there is still an urgent need for a non-destructive, 100% screening test for ionizing dose hardness. The present invention satisfies that need.

3.0 SUMMARY OF INVENTION

The present invention describes a testing procedure called CR-ANNEAL (for Cryogenic Radiation and Anneal) for testing all IC devices of a given type to determine their ionizing radiation hardness in a non-destructive manner. This is accomplished by exposing the ICs to radiation sufficient to cause failure while they are in a state of enhanced sensitivity (due to irradiating while they are cooled to a cryogenic temperature), warming them to normal temperature to remove almost all of the radiation damage inflicted by the cryogenic irradiation, and then calculating the radiation level at which they would suffer similar failure if the irradiation had been done at normal temperature.

FIG. 5 illustrates the principle on which Cryogenic Radiation and Anneal is based. This figure shows measured values of the gate thresh-old voltage shift (used as a measure of ionizing radiation damage in this test) of an MOS device vs. total dose for a device irradiated at 85° K to a total dose of 30 Kilorads (Si), then warmed to 300° K and re-measured, cooled back to 85° K and irradiated again to 80 Kilorads (Si), warmed back to 300° K and again re-measured, cooled back to 85° K and irradiated again to 130 Kilorads (Si), and again warmed to 300° K and remeasured. The data shows that the gate threshold voltage shifts by about 5 volts for every 30 Kilorads (Si) when irradiated at 85° K, but that this shift is almost entirely removed when the device is warmed to 300° K. (Warming to room temperature permits the "small polarons" to move to the boundary of the silicon dioxide, and leave the silicon dioxide.) Furthermore, the device can be irradiated again and again, and the same behavior observed. While it is true that a slight residual voltage shift is seen after the second irradiation and warming, and a greater residual voltage shift is seen after the third irradiation and warming, the ability to put the device in a state in which it has an increased sensitivity to ionizing dose by cooling it to cryogenic temperatures, and to remove almost all the damage inflicted on it by merely warming it back to room temperature is clearly demonstrated.

To apply this technique to CMOS ICs, it is first necessary to identify the parameter(s) to be used as a measure of ionizing dose damage. To do this, one or more integrated circuit parameters with the following properties are selected as monitors of the damage that ionizing radiation creates in the DUT.

(1) They can be conveniently measured non-destructively on a CMOS digital IC as a function of accumulated ionizing dose at cryogenic temperatures and at room temperature. (NOTE: It will be assumed that the measurements to be done at cryogenic temperature will be performed at 77° K, since this temperature is easily and inexpensively reached using liquid nitrogen as a coolant. It should be noted, however, that since "small polarons" have no mobility at temperatures below 160° K, any temperature below 160° K can be used for the cryogenic measurements. (Temperatures above 160° K can also be used, but the time that can be allowed to elapse between exposure to radiation and the measurement of the monitor parameter(s) gets progressively shorter as the temperature increases above 160° K, until at temperatures near 200° K, this time gets so short that it would be impossible to perform the measurement with accuracy. To avoid the need to control this time, measurements below 160° K are recommended.) Also, room temperature measurements, referred to below as RT measurements, or 300° K measurements, can be done at any temperature over the wide range found in laboratories.)

(2) They change as a function of the amount of the ionizing radiation that the device receives.

(3) They are quantitative measures of the degradation of some aspects of the device performance by the radiation.

The procedure described in this invention varies somewhat, depending upon whether the device of interest falls in category I or category II of Table 1. As indicated in FIGS. 6 and 7 for devices in category I which fail parametrically and functionally, respectively, the monitor parameters are first measured for the device under test (DUT) at RT. (Functional tests are also performed on devices that exhibit functional failure.). The DUT is then cooled to a temperature less than approximately 160° K, e.g. 77° K, and these measurements repeated to characterize the pre-radiation performance of the DUT at RT and at 77° K. The DUT is then given several increments of ionizing dose at 77° K, and the monitor parameters are measured (still at 77° K) after each increment of dose so that curves of the selected currents versus dose at 77° K can be plotted. (Functional tests are also performed on devices that exhibit functional failure.) FIGS. 8 and 9 illustrate the process for devices falling under category II and failing parametrically and functionally, respectively.

Once failure is observed, the value of the monitor parameters that are measured at this value of total dose can be used as indicators of the damage level required to cause failure. By comparing the changes in the monitor currents caused by radiation when the DUT is in its sensitized state, to the changes in their values between those taken in the normal state before radiation, and those taken in the normal state after the radiation and return to the normal state, it is found that the change in these currents in the sensitized state exceeds the change in the normal state by a significant factor. This factor is called the relative effectiveness (R.E.), and states quantitatively how much more effective radiation at cryogenic temperature is in damaging CMOS ICs than is radiation at room temperature. Since the irradiated devices were damaged sufficiently either to fail to meet the limits adopted for the monitor parameters, or to fail functionally, upon receiving a dose $D_{Fail,\ cold}$ at cryogenic temperature, and since the damage at the low temperature is more effective by a factor R.E. than is damage inflicted at room temperature, then one can safely predict that the dose required to produce a similar failure at room temperature would be greater than $D_{Fail,\ cold}$ by a factor R.E. The user then compares the predicted dose-to-failure at room temperature $D_{Fail,\ warm}$ ($D_{Fail,\ warm}=D_{Fail,\ cold}$ times R.E.) to the radiation specification for his application, and decides whether it is sufficiently hard for his application. The devices found by this procedure to be sufficiently radiation hard are used, while the others are rejected.

After completion of the above radiation series at 77° K the DUT is warmed to RT, and the monitor currents re-measured (and functional measurements, if necessary). It is expected that the values of the monitor parameters read at RT will be close to the pre-rad values of these parameters measured at RT, i.e., little residual damage to the DUT should remain due to the 77° K irradiations.

Prior research on the radiation response of $SiO_2$ has shown that the measured values of the RT monitor parameters, after warming from 77° K, are the values that the DUT would exhibit if it had been irradiated at RT to the maximum dose that the device received at 77° K. Similarly, the 77° K doses that would produce the same currents at 77°

K as the measured RT currents can be read from the measured curves of monitor parameter values versus dose at 77° K. Therefore, for each of the monitor parameters, the relative effectiveness (RE) of the radiation in damaging the DUT at 77° K and RT is the ratio of the doses that produced equal currents at 77° K and RT.

Thus, for a specified value of any of the monitor parameters, the dose that would produce that value at RT can be estimated as follows. From the measured curve for that parameter versus dose at 77° K, read the 77° K dose required to produce that parameter value. The RT dose to produce that value is then the 77° K dose to produce that current multiplied by the relative effectiveness of radiation in producing this parameter value at 77° K and RT.

If the application of interest is one for which the time-dependent buildup of interface traps will not cause device failure (e.g. if the ionizing dose is introduced in a short period of time, and the mission duration is also short, as in the case of applications in a strategic missile), or is one in which the user does not expect a significant amount of rebound in the gate threshold voltage for the NMOS transistors (due to the time-dependent buildup of interface traps after the conclusion of the irradiation), the experimental part of the screening procedure would be completed at this point. However, if interface traps are expected to be important in the intended application, additional steps are necessary. To speed up the growth of the interface traps the DUT would be annealed for 168 hrs (1 week) at 100° C. The DUT would then be returned to RT, and the monitor parameters re-measured. The difference between the monitor parameters at RT before and after the 100° C. anneal is a measure of the importance of interface traps on the performance of the DUT. If they are found to be important, then $D_{Fail,\ warm}$ must be calculated using data from a monitor parameter for which the effects of interface traps and oxide charge are additive, e.g. data from PMOS devices.

3.1 BRIEF DESCRIPTION OF DRAWINGS

4.0 DETAILED DESCRIPTION OF INVENTION

The details of the method to be used to implement this invention depend upon which of the categories in Table 1 the devices being tested fall under, and whether the IC type being tested fails parametrically or functionally. Devices falling under category I and failing parametrically are treated first, then those in category I that fail functionally. Category II device types are then discussed.

Figure 6:
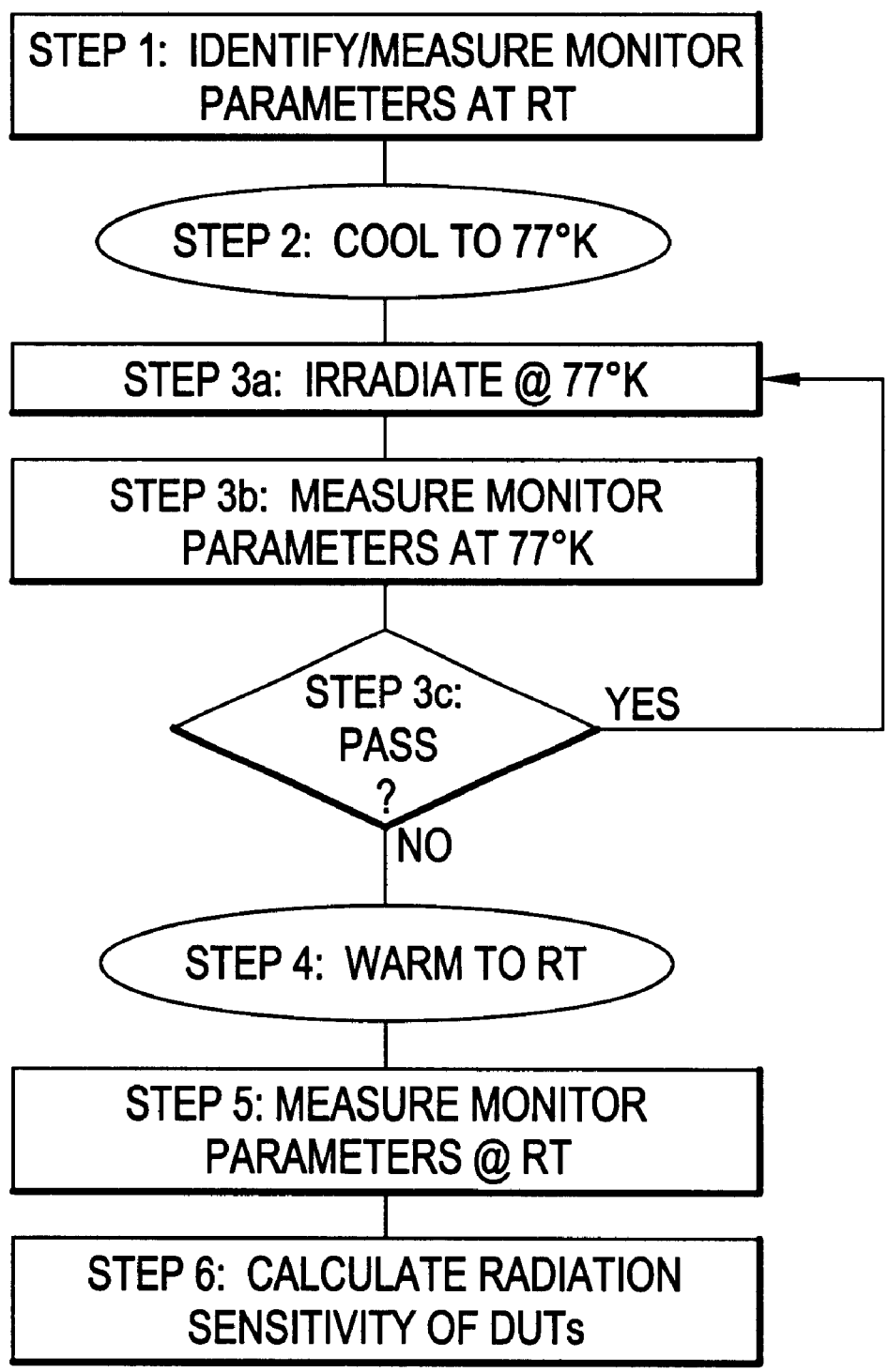
FIG. 6 illustrates a screen for category IICs failing functionally.

4.1 SCREEN FOR CATEGORY I CMOS ICs 4.1.1 Screen for Category I CMOS ICs Failing Parametrically The procedure for performing a 100% screen for ionizing radiation sensitivity of category I digital CMOS ICs characterized by radiation-induced parametric failures consists of several steps, shown in FIG. 6.

Step 1: IC parameters are identified which are related to the principal radiation-induced damage mechanisms, and which can be accessed easily by users. Research has shown that the "ON" current of the PMOS device in an output buffer, the "ON" current of an NMOS device in an output buffer, and the "OFF" current of an NMOS device in an output buffer are such parameters (although other monitor parameters could also be identified). These are called monitor parameters. (The "ON" current of the PMOS device in an output buffer determines the speed with which the output of a CMOS circuit can be driven from an "output low" state to an "output high" state, and is related to the threshold voltage of the PMOS device. The "ON" current of the NMOS device in an output buffer determines the speed with which the output of a CMOS circuit can be driven from an "output high" state to an "output low" state, and is related to the threshold voltage of the NMOS device. The "OFF" current of an NMOS device in an output buffer is a measure of radiation-induced inversion of P-type silicon under the field oxide, the principal radiation-induced failure mode in many different modern ICs.) Limits on these parameters (values at which the ICs would fail to meet important performance criteria such as speed) are also identified. These currents are then measured for the integrated circuits in question, to provide a baseline for their pre-irradiation values at room temperature.

Step 2: The devices under test (DUTs) are then placed in a state in which they are much more sensitive to the adverse effects of ionizing radiation than would be the case in normal operation, by cooling them to a cryogenic temperature. The temperature at which this enhanced radiation sensitivity is most conveniently achieved is that below which small polarons in silicon dioxide, described above, are not thermally activated, i.e. the temperature below which they are frozen in place. This is found to be 160° K. (Enhanced radiation sensitivity occurs at temperatures above this value, but since the small polarons produced by radiation can drift about due to thermal agitation above 160° K, at a rate that increases as the temperature increases above 160° K, enhanced radiation sensitivity becomes less pronounced as the time between radiation exposure and electrical testing increases. Consequently, performing these measurements would become more difficult above this temperature, and would become impossibly difficult if the temperature was as high as 200° K.)

Step 3: The monitor currents are then re-measured, to establish a base-line for their performance in the sensitized state.

Step 4: The candidate devices are subjected to several small doses of ionizing radiation, while maintaining them in the sensitized state, and the monitor currents re-measured after each exposure. This provides the data with which a plot of monitor currents vs. ionizing dose can be generated. Since the ICs are now in a state in which even small doses of ionizing dose degrade their performance seriously, measurable changes in monitor current values can be achieved without inflicting high radiation doses on the devices. These irradiations are continued until one or more of the monitor currents no longer meet the limits set for that parameter in Step 1. The ionizing radiation dose required to reach this point is designated $D_{fail,\ cold}$.

Step 5: The devices are then restored to their original unsensitized state, which removes most of the changes in the monitor currents produced by the low level of radiation exposure inflicted while the IC was in the sensitized state, and permits the DUT to, once again, meet the room temperature specification for that parameter.

Step 6: The monitor currents are measured at room temperature, to determine the changes in these currents from their pre-rad, RT value.

Step 7: By comparing the changes in the monitor currents caused by radiation when the DUT is in its sensitized state, to the changes in their values between those taken in the normal state before radiation, and those taken in the normal state after the radiation and return to the normal state, it is found that the change in these currents in the sensitized state exceeds the change in the normal state by a significant factor. This factor is called the relative effectiveness (R.E.), and states quantitatively how much more effective radiation at cryogenic temperature is in damaging CMOS ICs than is radiation at room temperature. Since the irradiated devices were damaged sufficiently to fail to meet the limits adopted in Step 1 upon receiving a dose $D_{Fail,\ cold}$ at cryogenic temperature, and since the damage at the low temperature is more effective by a factor R.E. than is damage inflicted at room temperature, then one can safely predict that the dose required to produce a similar failure at room temperature would be greater than $D_{Fail,\ cold}$ by a factor R.E. The user then compares the predicted dose-to-failure at room temperature $D_{Fail,\ warm}$ ($D_{Fail,\ warm} = D_{Fail,\ cold}$ times R.E.) to the radiation specification for his application, and decides whether it is sufficiently hard for his application. The devices found by this procedure to be sufficiently radiation hard are used, while those of insufficient hardness are rejected.

Even though this procedure requires that devices be irradiated with ionizing radiation, it is still classified as "non-destructive", since the devices retain almost no permanent damage as a result of this pre-irradiation. Military standards define the pre-irradiation of ICs as "non-destructive" as long as the dose delivered to the parts in the pre-irradiation is less than 10% of the failure dose at the temperature at which the device is to be used (nominally room temperature). [Cf. MIL-STD 883, Test Method 1020].

4.1.2 Screen for Category I CMOS ICs Failing Functionally

Figure 7:
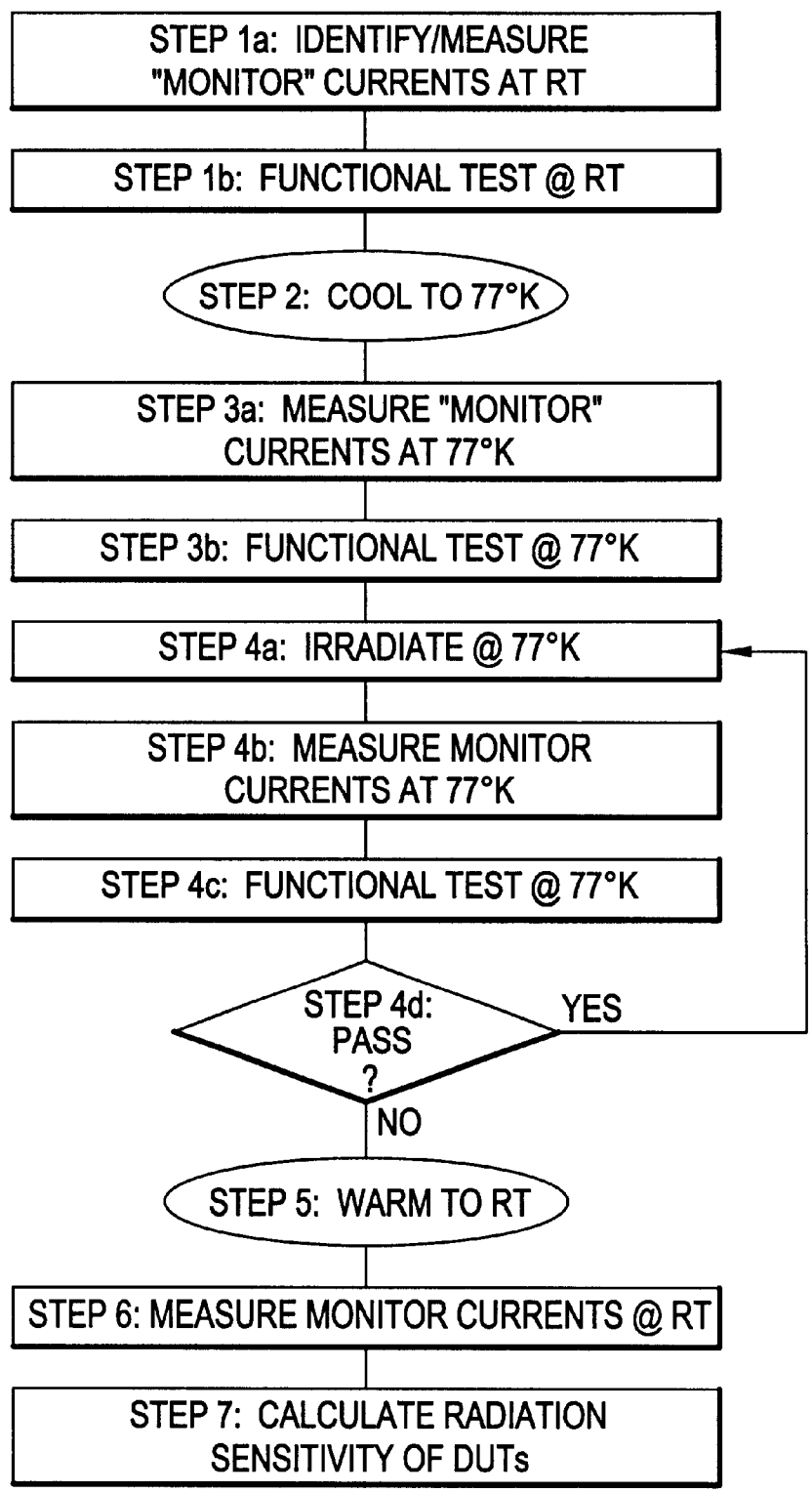
FIG. 7 illustrates a screen for category IICs failing parametrically.

The procedure for performing a 100% screen for ionizing radiation sensitivity of category I digital CMOS ICs characterized by radiation-induced functional failures is similar to that shown for devices failing parametrically, except for the way that the dose $D_{Fail,\ cold}$ is determined (Cf. FIG. 7). Before the monitor currents seen in ICs that fail functionally reach levels that would be classified as a "parametric failure", they cease operating. This is called a functional failure. Consequently, $D_{Fail,\ cold}$ for these devices is defined as the ionizing dose in step 4 at which the devices first fail functionally. Using this definition, the procedure for performing a 100% screen for ionizing radiation sensitivity of category I digital CMOS ICs characterized by radiation-induced functional failures consists of the following steps, illustrated in FIG. 7. Step 1: IC parameters are identified which are related to the principal radiation-induced damage mechanisms, and which can be accessed easily by users. Research has shown that the "ON" current of the PMOS device in an output buffer, the "ON" current of an NMOS device in an output buffer, and the "OFF" current of an NMOS device in an output buffer are such parameters (although other monitor parameters could also be identified). These are called monitor parameters. (The "ON" current of the PMOS device in an output buffer determines the speed with which the output of a CMOS circuit can be driven from an "output low" state to an "output high" state, and is related to the threshold voltage of the PMOS device. The "ON" current of the NMOS device in an output buffer determines the speed with which the output of a CMOS circuit can be driven from an "output high" state to an "output low" state, and is related to the threshold voltage of the NMOS device. The "OFF" current of an NMOS device in an output buffer is a measure of radiation-induced inversion of P-type silicon under the field oxide, the principal radiation-induced failure mode in many different modem ICs.) Limits on these parameters (values at which the ICs would fail to meet important performance criteria such as speed) are also identified. These currents are then measured for the integrated circuits in question, to provide a baseline for their pre-irradiation values at room temperature. Also, the devices are tested functionally at this point, to provide a baseline for their functional performance.

Step 2: The devices under test (DUTs) are then placed in a state in which they are much more sensitive to the adverse effects of ionizing radiation than would be the case in normal operation, by cooling them to a cryo-genic temperature. The temperature at which this enhanced radiation sensitivity is most conveniently achieved is that below which small polarons in silicon dioxide, described above, are not thermally activated, i.e. the temperature below which they are frozen in place. This is found to be 160° K. (Enhanced radiation sensitivity occurs at temperatures above this value, but since the small polarons produced by radiation can drift about due to thermal agitation above 160° K, at a rate that increases as the temperature increases above 160° K, enhanced radiation sensitivity becomes less pronounced as the time between radiation exposure and electrical testing increases. Consequently, performing these measurements would become more difficult above this temperature, and would become impossibly difficult if the temperature was as high as 200° K.)

Step 3: The monitor currents are then re-measured, to establish a base-line for their performance in the sensitized state. Also, the devices are tested functionally in the sensitized state.

Step 4: The candidate devices are subjected to several small doses of ionizing radiation, while maintaining them in the sensitized state, and the monitor currents re-measured after each exposure. This provides the data with which a plot of monitor currents vs. ionizing dose can be generated. Since the ICs are now in a state in which even small doses of ionizing dose degrade their performance seriously, measurable changes in monitor current values can be achieved without inflicting high radiation doses on the devices. The devices are also tested functionally at each of these ionizing dose levels. These irradiations are continued until functional failure is observed. The ionizing radiation dose required to reach this point is designated $D_{Fail, cold}$.

Step 5: The devices are then restored to their original unsensitized state, removing most of the changes in the monitor currents produced by the radiation exposure inflicted while the IC was in the sensitized state. This permits the DUT to, once again, function at room temperature.

Step 6: The monitor currents are measured at room temperature, to determine the changes in these currents from their pre-rad, room temperature value.

Step 7: By comparing the changes in the monitor currents caused by radiation when the DUT is in its sensitized state, to the changes in their values between those taken in the normal state before radiation, and those taken in the normal state after the radiation and return to the normal state, it is found that the change in these currents in the sensitized state exceeds the change in the normal state by a significant factor. This factor is called the relative effectiveness (R.E.), and states quantitatively how much more effective radiation at cryogenic temperature is in damaging CMOS ICs than is radiation at room temperature. Since the irradiated devices were damaged sufficiently to fail functionally upon receiving a dose $D_{Fail, cold}$ at cryogenic temperature, and since the damage at the low temperature is more effective by a factor R.E. than is damage inflicted at room temperature, then one can safely predict that the dose required to produce a similar failure at room temperature would be greater than $D_{Fail, cold}$ by a factor R.E. The user then compares the predicted dose-to-failure at room temperature $D_{Fail, warm}$ ($D_{Fail, warm} = D_{Fail, cold}$ times R.E.) to the radiation specification for his application, and decides whether it is sufficiently hard for his application. The devices found by this procedure to be sufficiently radiation hard for the application are used, while those of insufficient hardness are rejected.

As before, even though this procedure requires that devices be irradiated with ionizing radiation, it is still classified as "non-destructive", since the devices retain almost no permanent damage as a result of this pre-irradiation. This is consistent with previous practice with military standards, which define the pre-irradiation of ICs as "non-destructive" as long as the dose delivered to the parts in the pre-irradiation is less than 10% of the failure dose at the temperature at which the device is to be used (nominally room temperature). [Cf. MIL-STD 883, Test Method 1020].

4.2 SCREEN FOR CATEGORY II CMOS ICS

As indicated in Table 1, devices can fail due to the buildup in interface traps as a result of radiation exposure. This results in a significant amount of rebound in the gate threshold voltage for the NMOS transistors. (Rebound is the name applied to a situation where the threshold voltage of NMOS devices $V_{TN}$ rises due to the time-dependent buildup of negatively charged interface traps after the conclusion of the irradiation, compensating partially or completely for the initial drop in $V_{TN}$ resulting from the trapping of positive charges created by radiation.) It is known that the buildup of interface traps can be accelerated, preferentially, by annealing at 100° C. Consequently, category II devices can be screened using the procedures shown in FIGS. 6 and 7, followed by a 100° C. anneal, as illustrated in FIGS. 8 and 9, and detailed below.

4.2.1 Screen for category II CMOS ICs failing parametrically

Figure 8:
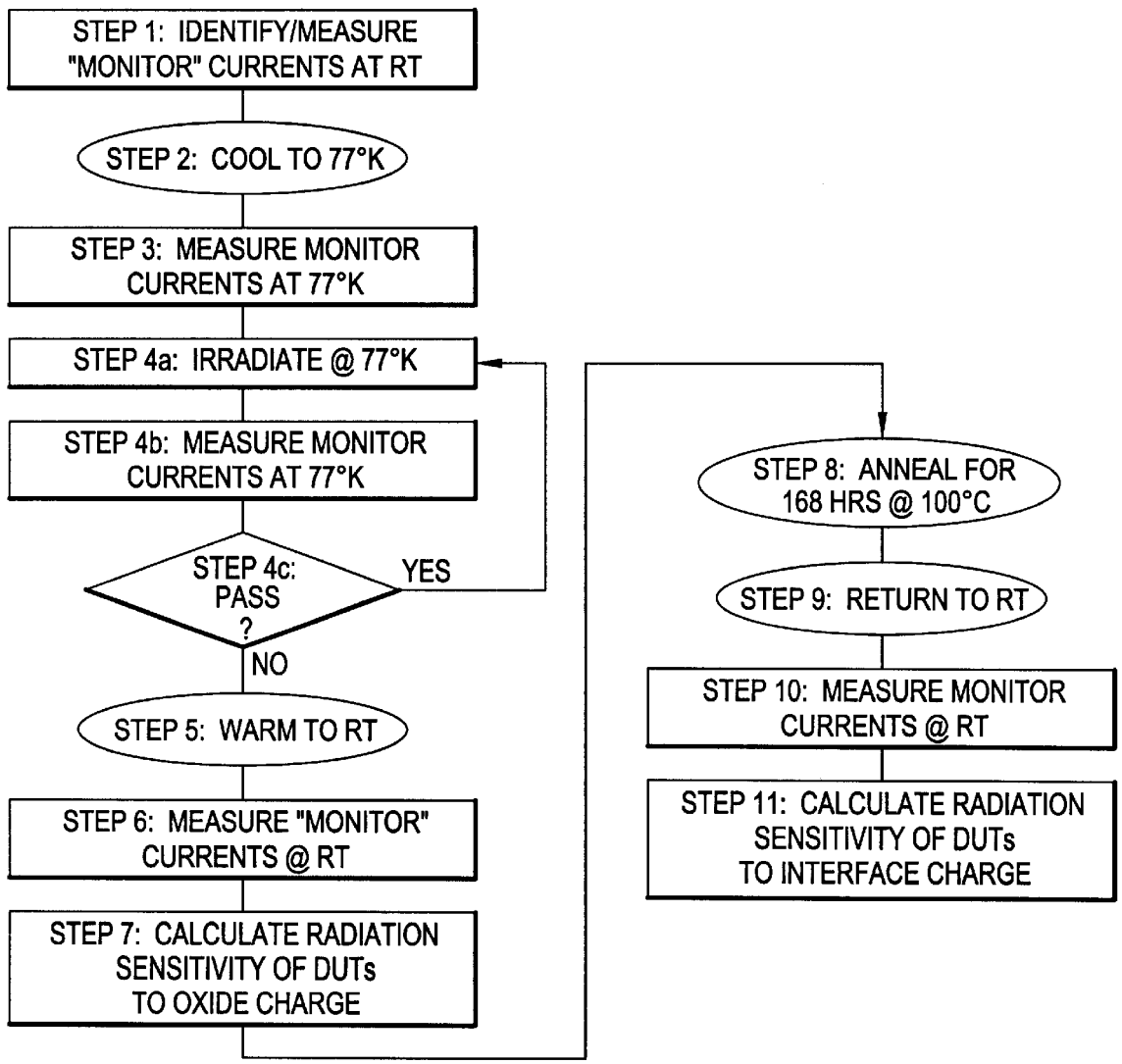
FIG. 8 illustrates a screen for category IIICs failing parametrically.
Figure 9:
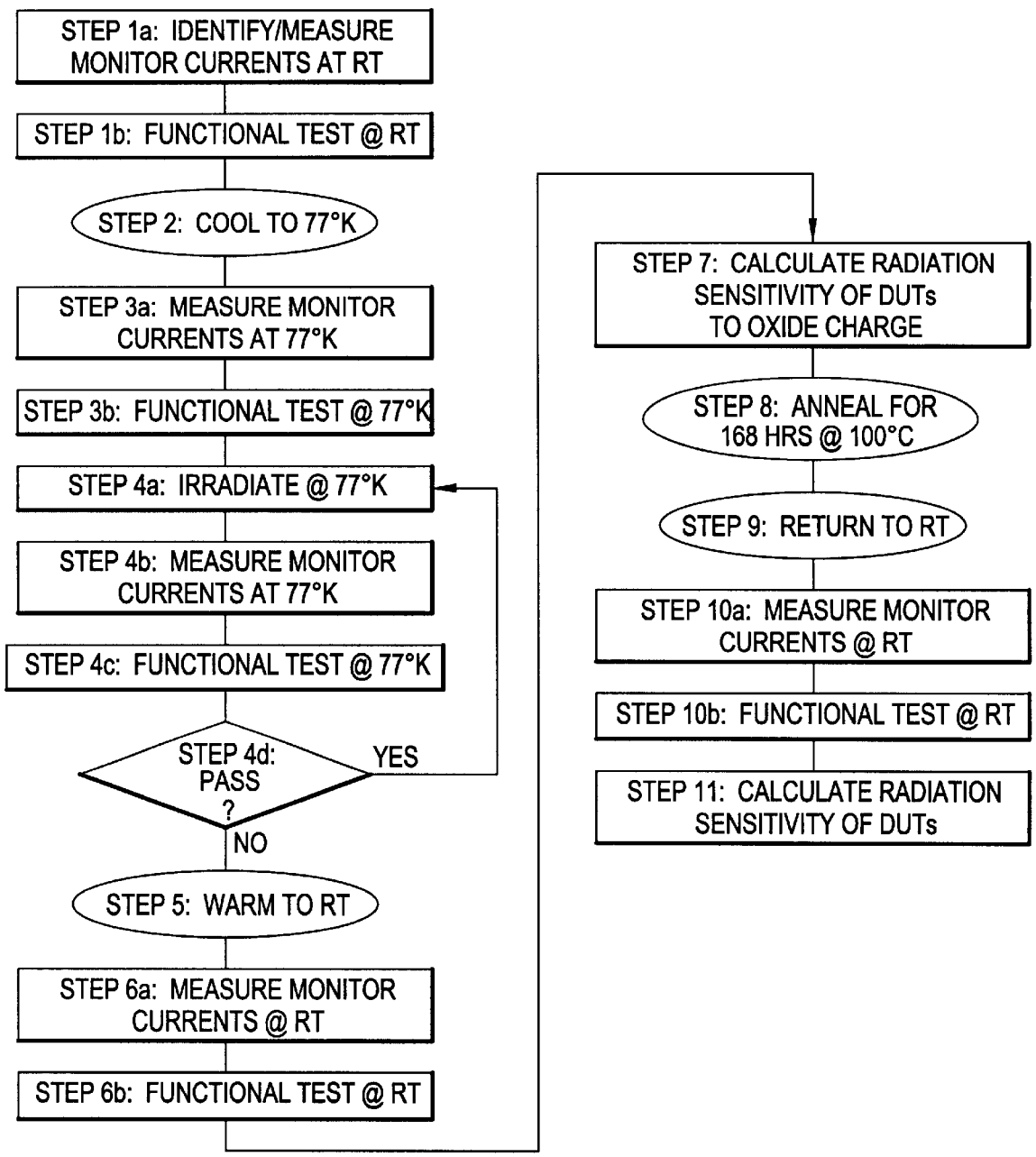
FIG. 9 illustrates a screen for category IIICs failing functionally.

The procedure for performing a 100% screen for ionizing radiation sensitivity of category II digital CMOS ICs characterized by radiation-induced parametric failures consists of several steps, shown in FIG. 8.

Step 1: IC parameters are identified which are related to the principal radiation-induced damage mechanisms, and which can be accessed easily by users. Research has shown that the "ON" current of the PMOS device in an output buffer, the "ON" current of an NMOS device in an output buffer, and the "OFF" current of an NMOS device in an output buffer are such parameters (although other monitor parameters could also be identified). These are called monitor parameters. (The "ON" current of the PMOS device in an output buffer determines the speed with which the output of a CMOS circuit can be driven from an "output low" state to an "output high" state, and is related to the threshold voltage of the PMOS device. The "ON" current of the NMOS device in an output buffer determines the speed with which the output of a CMOS circuit can be driven from an "output high" state to an "output low" state, and is related to the threshold voltage of the NMOS device. The "OFF" current of an NMOS device in an output buffer is a measure of radiation-induced inversion of P-type silicon under the field oxide, the principal radiation-induced failure mode in many different modem ICs.) Limits on these parameters (values at which the ICs would fail to meet important performance criteria such as speed) are also identified. These currents are then measured for the integrated circuits in question, to provide a baseline for their pre-irradiation values at room temperature. Step 2: The devices under test (DUTs) are then placed in a state in which they are much more sensitive to the adverse effects of ionizing radiation than would be the case in normal operation, by cooling them to a cryo-genic temperature. The temperature at which this enhanced radiation sensitivity is most conveniently achieved is that below which small polarons in silicon dioxide, described above, are not thermally activated, i.e. the temperature below which they are frozen in place. This is found to be 160° K. (Enhanced radiation sensitivity occurs at temperatures above this value, but since the small polarons produced by radiation can drift about due to thermal agitation above 160° K, at a rate that increases as the temperature increases above 160° K, enhanced radiation sensitivity becomes less pronounced as the time between radiation exposure and electrical testing increases. Consequently, performing these measurements would become more difficult above this temperature, and would become impossibly difficult if the temperature was as high as 200° K.)

Step 3: The monitor currents are then re-measured, to establish a base-line for their performance in the sensitized state.

Step 4: The candidate devices are subjected to several small doses of ionizing radiation, while maintaining them in the sensitized state, and the monitor currents re-measured after each exposure. This provides the data with which a plot of monitor currents vs. ionizing dose can be generated. Since the ICs are now in a state in which even small doses of ionizing dose degrade their performance seriously, measurable changes in monitor current values can be achieved without inflicting high radiation doses on the devices. These irradiations are continued until one or more of the monitor currents no longer meet the limits set for that parameter in Step 1. The ionizing radiation dose required to reach this point is designated $D_{fail,\ cold}$.

Step 5: The devices are then restored to their original unsensitized state, which removes most of the changes in the monitor currents produced by the low level of radiation exposure inflicted while the IC was in the sensitized state, and permits the DUT to, once again, meet the room temperature specification for that parameter.

Step 6: The monitor currents are measured at room temperature, to determine the changes in these currents from their pre-rad value.

Step 7: By comparing the changes in the monitor currents caused by radiation when the DUT is in its sensitized state, to the changes in their values between those taken in the normal state before radiation, and those taken in the normal state after the radiation and return to the normal state, it is found that the change in these currents in the sensitized state exceeds the change in the normal state by a significant factor. This factor is called the relative effectiveness (R.E.), and states quantitatively how much more effective radiation at cryogenic temperature is in damaging CMOS ICs than is radiation at room temperature. Since the irradiated devices were damaged sufficiently to fail to meet the limits adopted in Step 1 upon receiving a dose $D_{Fail\ cold}$ at cryogenic temperature, and since the damage at the low temperature is more effective by a factor R.E. than is damage inflicted at room temperature, then one can safely predict that the dose required to produce a similar failure at room temperature, due to oxide trapped charge, would be greater than $D_{Fail,\ cold}$ by a factor R.E. The dose-to-failure at room temperature is given by $D_{Fail,\ warm} = D_{Fail,\ cold}$ times R.E. As before, this test is considered non-destructive, in keeping with Military Standard procedures.

Step 8: To determine whether interface state formation can generate any failure mechanisms that are not invoked by oxide trapped charge, the screening procedure is continued by annealing the DUTs for 168 hours at 100° C.

Step 9: After this anneal, the DUTs are returned to room temperature.

Step 10: The monitor currents are re-measured at room temperature.

Step 11: The radiation sensitivity of the DUTs is again determined, using the procedure described for Step 7, to determine whether there is any difference between $D_{Fail,\ warm}$ from Step 7 and the value calculated using the results of Step 10. If there is a significant difference, interface state charge buildup is significant for these DUTs, and $D_{Fail,\ warm}$ must be calculated using data from a monitor parameter for which the effects of interface states and oxide charge are additive, e.g. data from PMOS devices.

4.2.2 Screen for Category II CMOS ICs Failing Functionally

The procedure for performing a 100% screen for ionizing radiation sensitivity of category II digital CMOS ICs characterized by radiation-induced functional failures is similar to that shown for category devices failing parametrically, except for the way that the dose $D_{Fail,\ cold}$ is determined. Before the monitor currents seen in ICs that fail functionally reach levels that would be classified as a "parametric failure", they cease operating. This is called a functional failure. Consequently, $D_{Fail,\ cold}$ for these devices is defined as the ionizing dose in step 4 at which the devices first fail functionally. Using this definition, the procedure for performing a 100% screen for ionizing radiation sensitivity of category II digital CMOS ICs characterized by radiation-induced functional—failures consists of the following steps, illustrated in FIG. 9.

Step 1: IC parameters are identified which are related to the principal radiation-induced damage mechanisms, and which can be accessed easily by users. Research has shown that the "ON" current of the PMOS device in an output buffer, the "ON" current of an NMOS device in an output buffer, and the "OFF" current of an NMOS device in an output buffer are such parameters (although other monitor parameters could also be identified). These are called monitor parameters. (The "ON" current of the PMOS device in an output buffer determines the speed with which the output of a CMOS circuit can be driven from an "output low" state to an "output high" state, and is related to the threshold voltage of the PMOS device. The "ON" current of the NMOS device in an output buffer determines the speed with which the output of a CMOS circuit can be driven from an "output high" state to an "output low" state, and is related to the threshold voltage of the NMOS device. The "OFF" current of an NMOS device in an output buffer is a measure of radiation-induced inversion of P-type silicon under the field oxide, the principal radiation-induced failure mode in many different modem ICs.) Limits on these parameters (values at which the ICs would fail to meet important performance criteria such as speed) are also identified. These currents are then measured for the integrated circuits in question, to provide a baseline for their pre-irradiation values at room temperature. Also, the devices are tested functionally at this point, to provide a baseline for their functional performance.

Step 2: The devices under test (DUTs) are then placed in a state in which they are much more sensitive to the adverse effects of ionizing radiation than would be the case in normal operation, by cooling them to a cryo-genic temperature. The temperature at which this enhanced radiation sensitivity is most conveniently achieved is that below which small polarons in silicon dioxide, described above, are not thermally activated, i.e. the temperature below which they are frozen in place. This is found to be 160° K. (Enhanced radiation sensitivity occurs at temperatures above this value, but since the small polarons produced by radiation can drift about due to thermal agitation above 160° K, at a rate that increases as the temperature increases above 160° K, enhanced radiation sensitivity becomes less pronounced as the time between radiation exposure and electrical testing increases. Consequently, performing these measurements would become more difficult above this temperature, and would become impossibly difficult if the temperature was as high as 200° K.)

Step 3: The monitor currents are then re-measured, to establish a base-line for their performance in the sensitized state. Also, the devices are tested functionally in the sensitized state.

Step 4: The candidate devices are subjected to several small doses of ionizing radiation, while maintaining them in the sensitized state, and the monitor currents re-measured after each exposure. This provides the data with which a plot of monitor currents vs. ionizing dose can be generated. Since the ICs are now in a state in which even small doses of ionizing dose degrade their performance seriously, measurable changes in monitor current values can be achieved without inflicting high radiation doses on the devices. The devices are also tested functionally at each of these ionizing dose levels. These irradiations are continued until functional failure is observed. The ionizing radiation dose required to reach this point is designated $D_{Fail, cold}$.

Step 5: The devices are then restored to their original unsensitized state, which removes most of the changes in the monitor currents produced by the low level of radiation exposure inflicted while the IC was in the sensitized state, and permits the DUT to, once again, function at room temperature.

Step 6: The monitor currents are measured at room temperature, to determine the changes in these currents from their pre-rad, room temperature value. The DUTs are also tested functionally, and the radiation sensitivity predicted for these devices.

Step 7: By comparing the changes in the monitor currents caused by radiation when the DUT is in its sensitized state, to the changes in their values between those taken in the normal state before radiation, and those taken in the normal state after the radiation and return to the normal state, it is found that the change in these currents in the sensitized state exceeds the change in the normal state by a significant factor. This factor is called the relative effectiveness (R.E.), and states quantitatively how much more effective radiation at cryogenic temperature is in damaging CMOS ICs than is radiation at room temperature. Since the irradiated devices were damaged sufficiently to fail functionally upon receiving a dose $D_{Fail, cold}$ at cryogenic temperature, and since the damage at the low temperature is more effective by a factor R.E. than is damage inflicted at room temperature, then one can safely predict that the dose required to produce a similar failure at room temperature due to oxide charge would be greater than $D_{Fail, cold}$ by a factor R.E. This predicts that the radiation sensitivity of the DUTs to oxide charge is such that the dose to failure at room temperature will be $D_{Fail, warm} = D_{Fail, cold}$ times R.E.

Step 8: The devices are then annealed for 168 hours at 100° C., to accelerate the formation of interface traps.

Step 9: The devices are returned to room temperature.

Step 10: The monitor currents are then re-measured at room temperature. Also, the devices are re-tested functionally.

Step 11: The radiation sensitivity of the DUTs is again determined, using the procedure described for Step 7, to determine whether there is any difference between $D_{Fail, warm}$ from Step 7 and the value calculated using the data from Step 10. If there is a significant difference, interface state charge buildup is significant for these DUTs, and $D_{Fail, warm}$ must be calculated using data from a monitor parameter for which the effects of interface states and oxide charge are additive, e.g. data from PMOS devices.

5.0 EXAMPLES

Several examples of this procedure are given below. Examples #1 and #2 deal with cases of category I devices. Example #3 deals with a case in which the 100° C. anneal was used because the user expects a significant time-dependent buildup of interface traps after the conclusion of the irradiation. This, in turn, would lead to a significant amount of rebound in the gate threshold voltage for the NMOS transistors. Example #4 deals with a case in which field oxide damage was the primary damage mechanism.

5.1 Example #1

Category I IC: NMOS "ON" Current as a Monitor Parameter

Figure 10A:
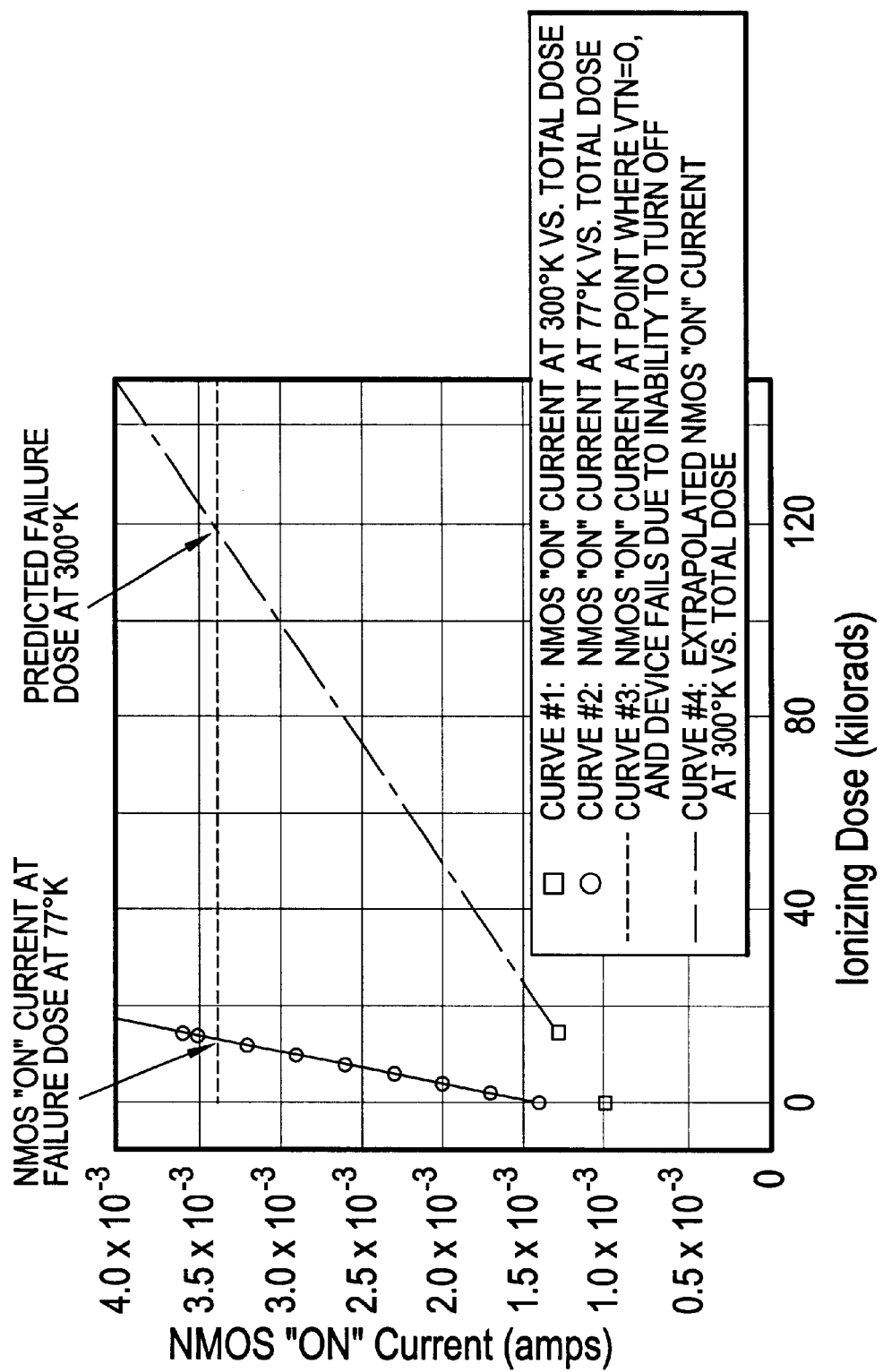
FIG. 10a is a graph of Monitor Current #1 (NMOS "ON" current) vs. ionizing dose, in example Case #1 of the application of the invention.
Figure 10B:
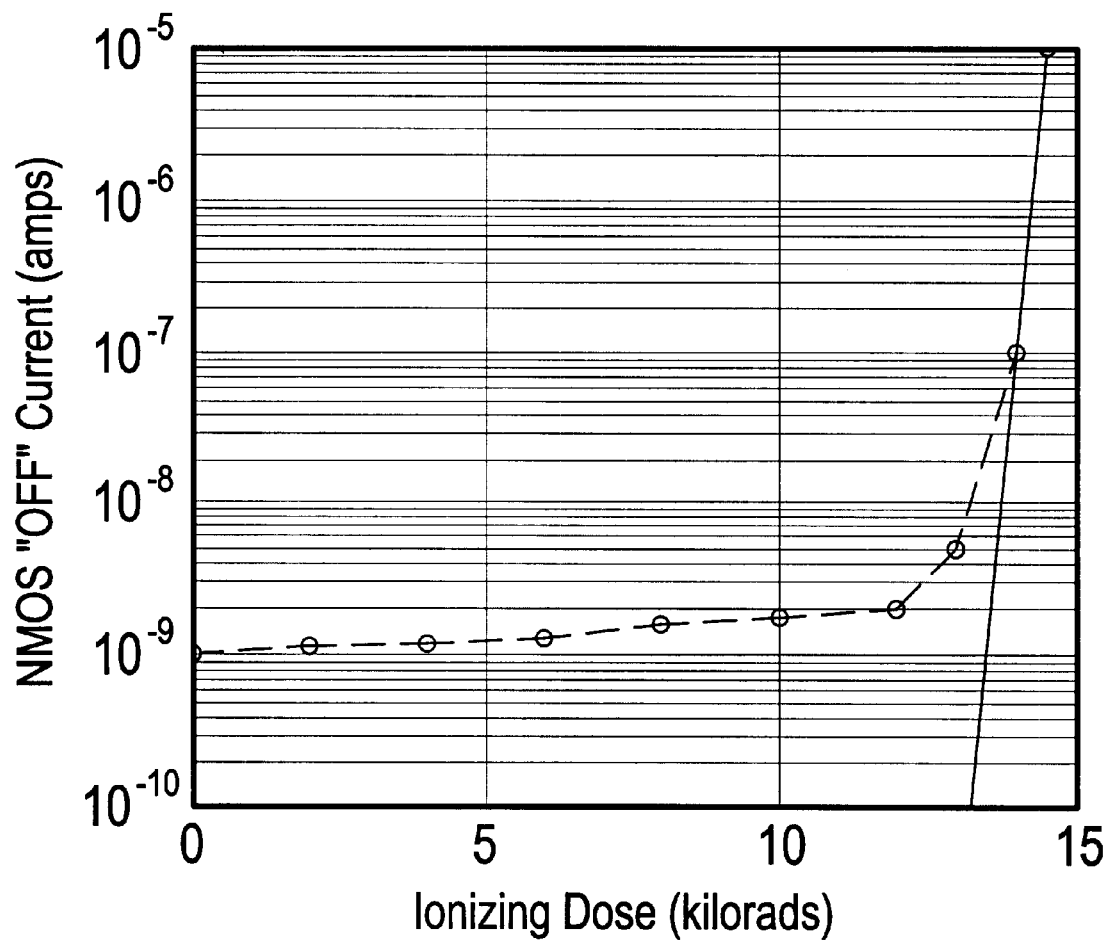
FIG. 10b is a graph of Monitor Current #2 (NMOS "OFF" current) vs. ionizing, in example Case #1 of the application of the invention.

FIGS. 10a and 10b show a graphical example of how the 100% screen procedure would be implemented for a Category I device for which the gate oxide of the NMOS device is the major cause of ionizing dose failure for the DUT. Using the procedure shown in FIG. 6, monitor parameter(s) are first identified. For this device, the "ON" current and the "OFF" current of the NMOS device in the output buffer are used as monitor parameters. (Other monitor parameters can be used as well, but in this example, the behavior seen for the NMOS "ON" and "OFF" currents will be examined in detail.)

The "ON" current of the NMOS device in an output buffer determines the speed with which the output of a CMOS circuit can be driven from an "output high" state to an "output low" state. Also, it is a measure of the threshold voltage of the NMOS device. As ionizing dose is accumulated, the threshold voltage of the NMOS device in the output buffer, $V_{TN}$, decreases in magnitude, increasing the "ON" current which this device can supply, and speeding up the circuit. However, this improvement cannot continue indefinitely. When $V_{TN}$ has been reduced to zero, the NMOS device won't turn off, and the device fails because of an inability to switch, i.e. it suffers functional failure. To determine when $V_{TN}$ has reached zero, the "OFF" current of the NMOS device is monitored. As $V_{TN}$ approaches zero, $I_{OFF}$ increases dramatically, signifying that the device has failed.

To determine the ionizing dose at which this will occur at 300° K, the DUT is first tested for the "ON" and "OFF" currents of the NMOS device in the output buffer at 300° K and at 77° K, as indicated in Steps #1 and #2 of FIG. 6. The $I_{ON}$ values are shown on the vertical axis of FIG. 10a as points on curves #1 and #2 at zero ionizing dose. (It will be noted that the value of the NMOS "ON" current is higher at 77° K than it is at 300° K. This is so because the mobility of the carriers in the channel of the NMOS device is higher at lower temperatures, and this increase in mobility is sufficient to produce a higher "ON" current at the lower temperature.)

The DUT is then irradiated in small increments of ionizing dose until $I_{OFF}$ begins to rise sharply (starting at about 12 Krads (Si)), while being held at a temperature of 77° K. After each increment of ionizing dose, the NMOS "ON" and "OFF" currents are measured and plotted, $I_{ON}$ vs. total dose in FIG. 10a, and $I_{OFF}$ vs. total dose in FIG. 10b. Functional failure is judged to have occurred at 13.26 Krad, from the sharp increase in the NMOS "OFF" current that begins at that dose.

The DUT is then warmed to 300° K, and the NMOS "ON" current measured at that temperature. The value of the NMOS "ON" current at 300° K was plotted as the second point on curve #1 of FIG. 10a. The two points for the NMOS "ON" current (one pre-rad and one at 14.5 Krad (Si)) permit curve #4 (Extrapolated NMOS "ON" current at 300° K vs. total dose) to be constructed in FIG. 10a.

The $I_{OFF}$ current of the NMOS device at 77° K is shown vs. ionizing dose in FIG. 10b. The value of $I_{OFF}$ is very low, but begins to increase sharply with ionizing dose as $V_{TN}$ approaches zero. The ionizing dose where it begins to rise sharply has been estimated, from the data in FIG. 10b, to occur at 13.26 Krad (Si). Using this value of total dose as the point at which the device would fail, it is noted in FIG. 10a that the value of $I_{ON}$ at 77° K for this ionizing dose value would be 3.38E-3 A. We therefore conclude that this device will suffer functional failure whenever the NMOS "ON" current reaches 3.38E-3 amps. By extrapolating the two points on Curve #1 of FIG. 10 to find the ionizing dose at which the NMOS "ON" current would reach 3.38E-3 amps at 300° K, we predict an ionizing dose for functional failure at room temperature of 120 Krad (Si).

5.2 Example #2

Category I IC: PMOS "ON" Current as a Monitor Parameter

Figure 11:
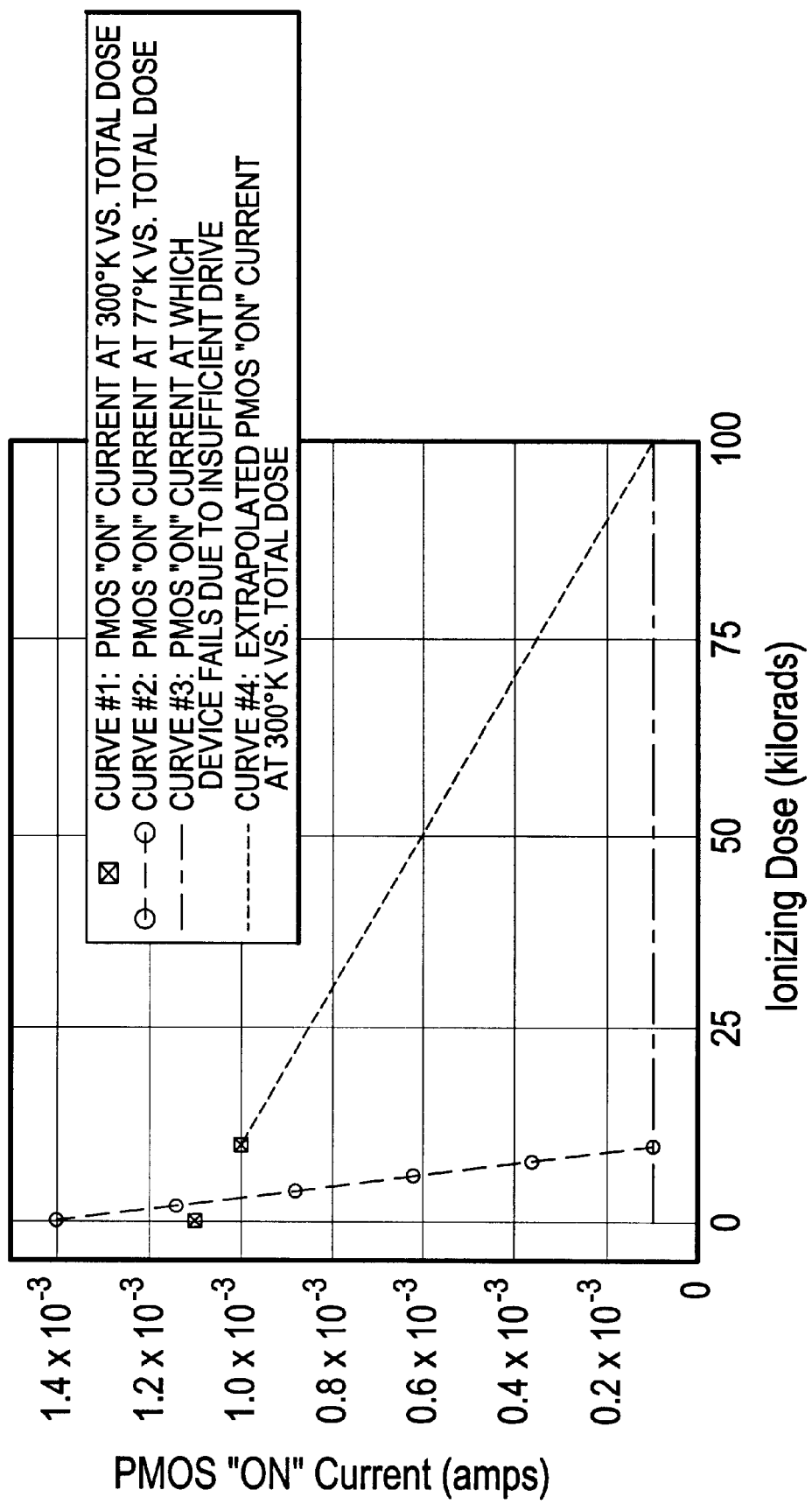
FIG. 11 is a graph of Monitor Current #3 (PMOS "ON" current) vs. ionizing dose, in example Case #2 of the application of the invention.

FIG. 11 shows a graphical example of how this procedure would be implemented for a hypothetical category I device which suffered parametric failure due to radiation exposure. Using the procedure shown in FIG. 7, monitor parameter(s) are first identified. For this device, the "ON" current of the PMOS device in an output buffer was used as a monitor parameter. (Other monitor parameters can be used as well, but in this example, the behavior seen for the PMOS "ON" current will be examined in detail.) The "ON" current of the PMOS device in an output buffer determines the speed with which the output of a CMOS circuit can be driven from an "output low" state to an "output high" state. As ionizing dose is accumulated, the threshold voltage of the PMOS device in the output buffer, $V_{TP}$, increases in magnitude, reducing the "ON" current which this device can supply. Eventually, this current becomes inadequate to permit the device to make this transition within the specified time, and the device fails parametrically. The dashed line at 0.1E-3 amps (Curve #3) in FIG. 11 is the value of PMOS "ON" current for which this occurs. Consequently, whenever the PMOS "ON" current reaches 0.1E-3 amps, the device will have suffered parametric failure.

To determine the ionizing dose at which this will occur at room temperature, the DUT is first tested for this parameter at 300° K (Step 1 in FIG. 7) and at a temperature less than approximately 160° K, e.g. 77° K (Step 3). Points representing the values of the PMOS "ON" current at these temperatures are shown in FIG. 11 at zero ionizing dose. (It will be noted that the value of the PMOS "ON" current is higher at 77° K than it is at 300° K. This is so because the mobility of the carriers in the channel of the PMOS device is higher at lower temperatures, and this increase in mobility is sufficient to produce a higher "ON" current at the lower temperature.)

The DUT is then irradiated in increments of 2 Krads (Si) to a total dose of 10 Krads (Si) while retaining the device at cryogenic temperature, as indicated in Step 3 of FIG. 7. After each increment of ionizing dose, the PMOS "ON" current is measured and plotted in FIG. 11. (These points and the pre-radiation point measured at 77° K in Step 3, make up curve #2 of FIG. 11.) This data shows that at 10 Krads (Si), the PMOS "ON" current drops below the value at which the device would fail due to insufficient drive.

Figure 2:
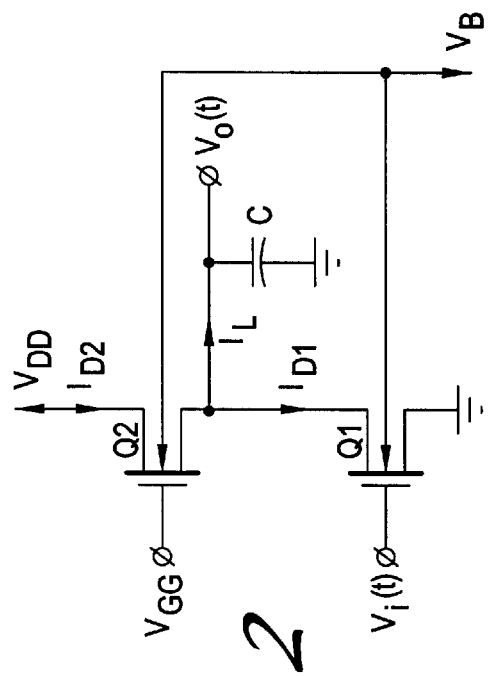
FIG. 2 is a circuit schematic showing how such transistors would be used in the simplest CMOS circuit (an inverter). The PMOS device is shown as Q2 in this diagram, and the NMOS device is shown as Q1.
Figure 1:
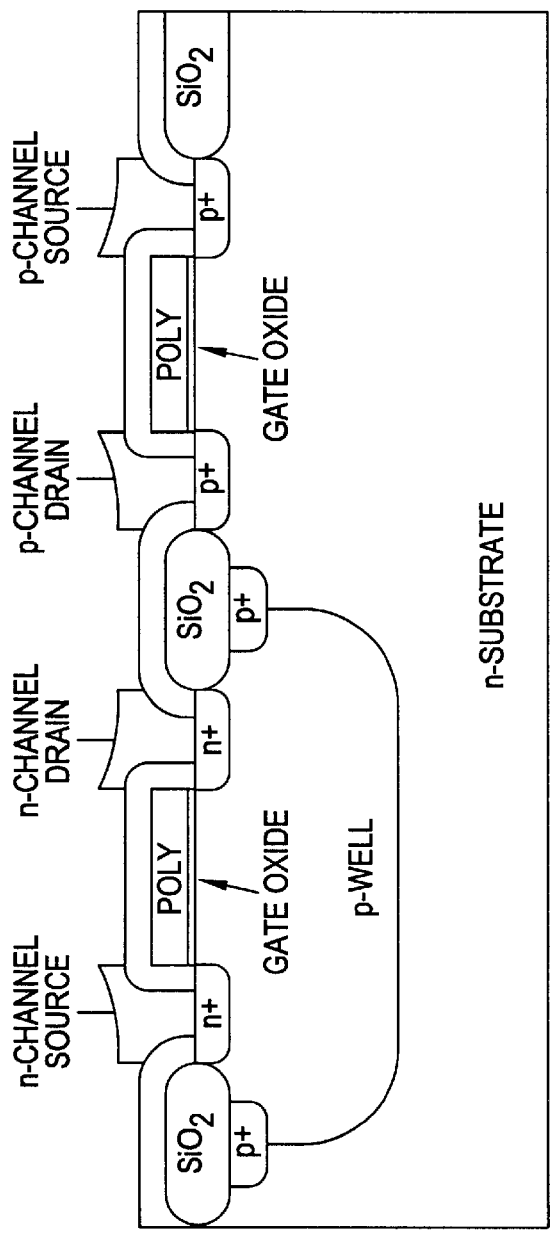
FIG. 1 shows a cross sectional view of the PMOS and NMOS transistors that are used in CMOS ICs, with the gate oxide labeled as such, and the field oxide identified as the $SiO_2$ region.
Figure 3:
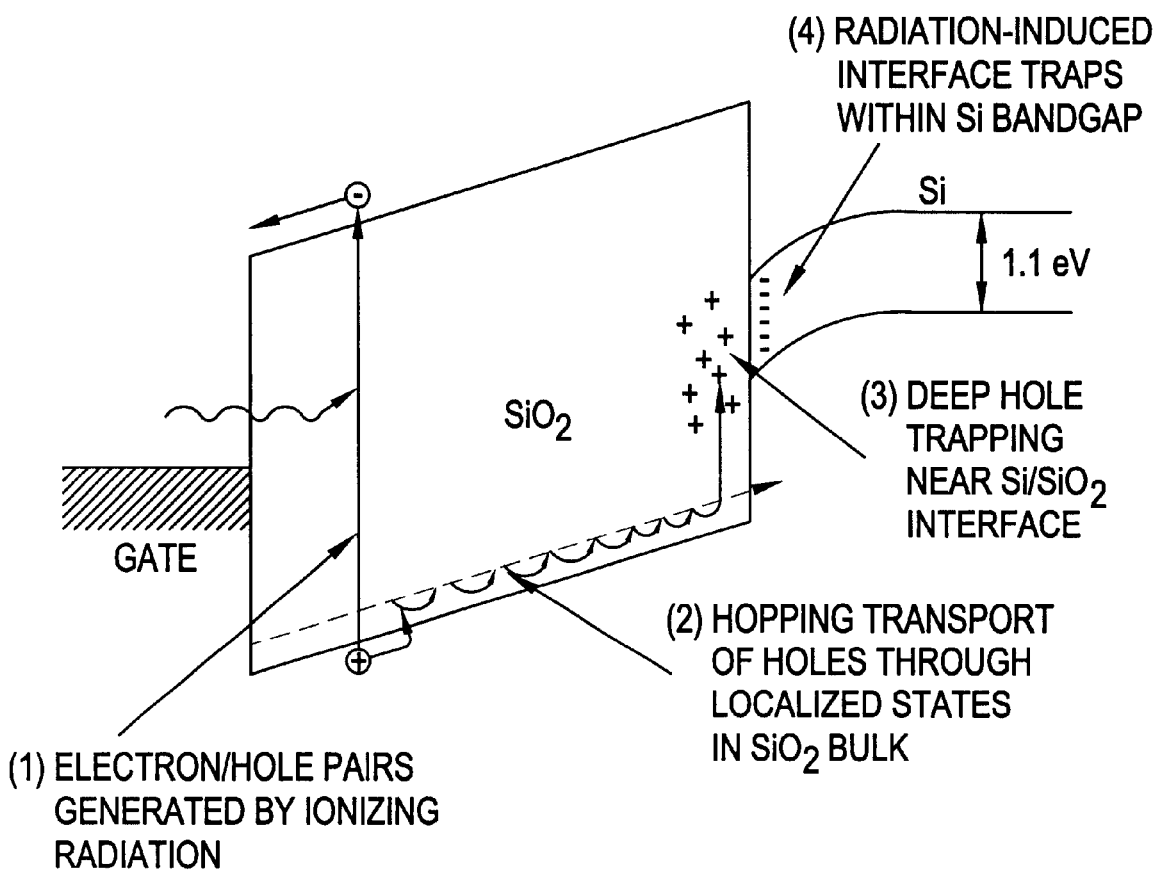
FIG. 3 is a diagram showing ionizing radiation induced effects in an NMOS element of a CMOS integrated circuit under positive gate bias.
Figure 4:
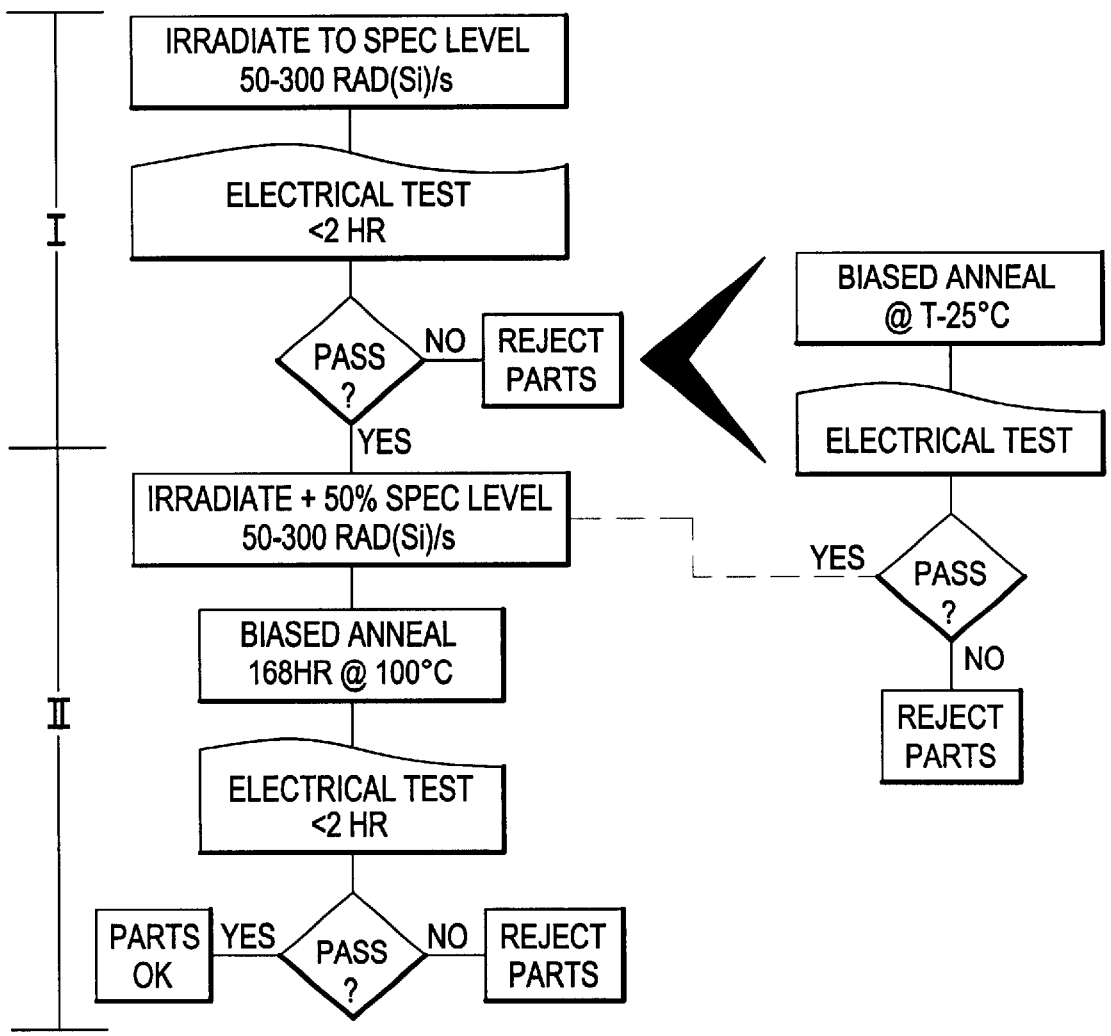
FIG. 4 is a flow chart depicting a prior art method of testing a sample of ICs from a homogeneous population of devices to determine the ionizing dose hardness of the parent population. It is the Main Test Flow for Military Standard MIL-STD-883D, Test Method 1019.4.
Figure 5:
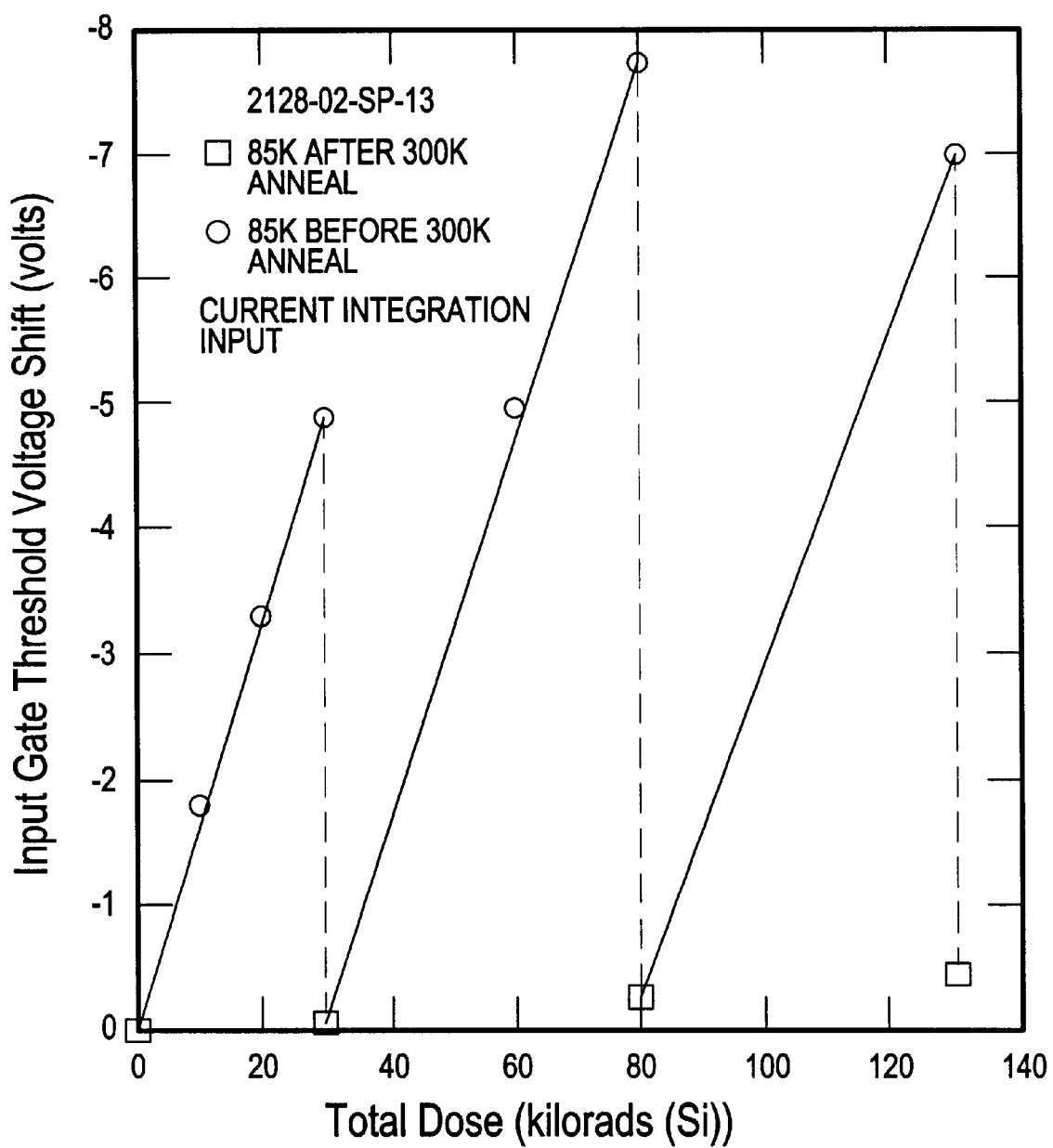
FIG. 5 is graph of the gate threshold voltage shift for an MOS device in response to radiation at 85° K and after 300° K annealing.

The DUT is then warmed to 300° K, and the PMOS "ON" current measured at that temperature. This value (1E-3 amps in FIG. 1) when combined with the value of this current measured at room temperature before radiation, permits one to project how the PMOS "ON" current will vary with total dose at room temperature. This projection is shown in FIG. 11 as Curve #4. Curve #4 intersects Curve #3 (the value of the PMOS "ON" current at 300° K at which the device would fail) at 100 Krad (Si). Thus, the predicted failure dose for this DUT due to loss of the ability to drive the output from low to high is 100 Krad (Si).

5.3 Example #3

Figure 12:
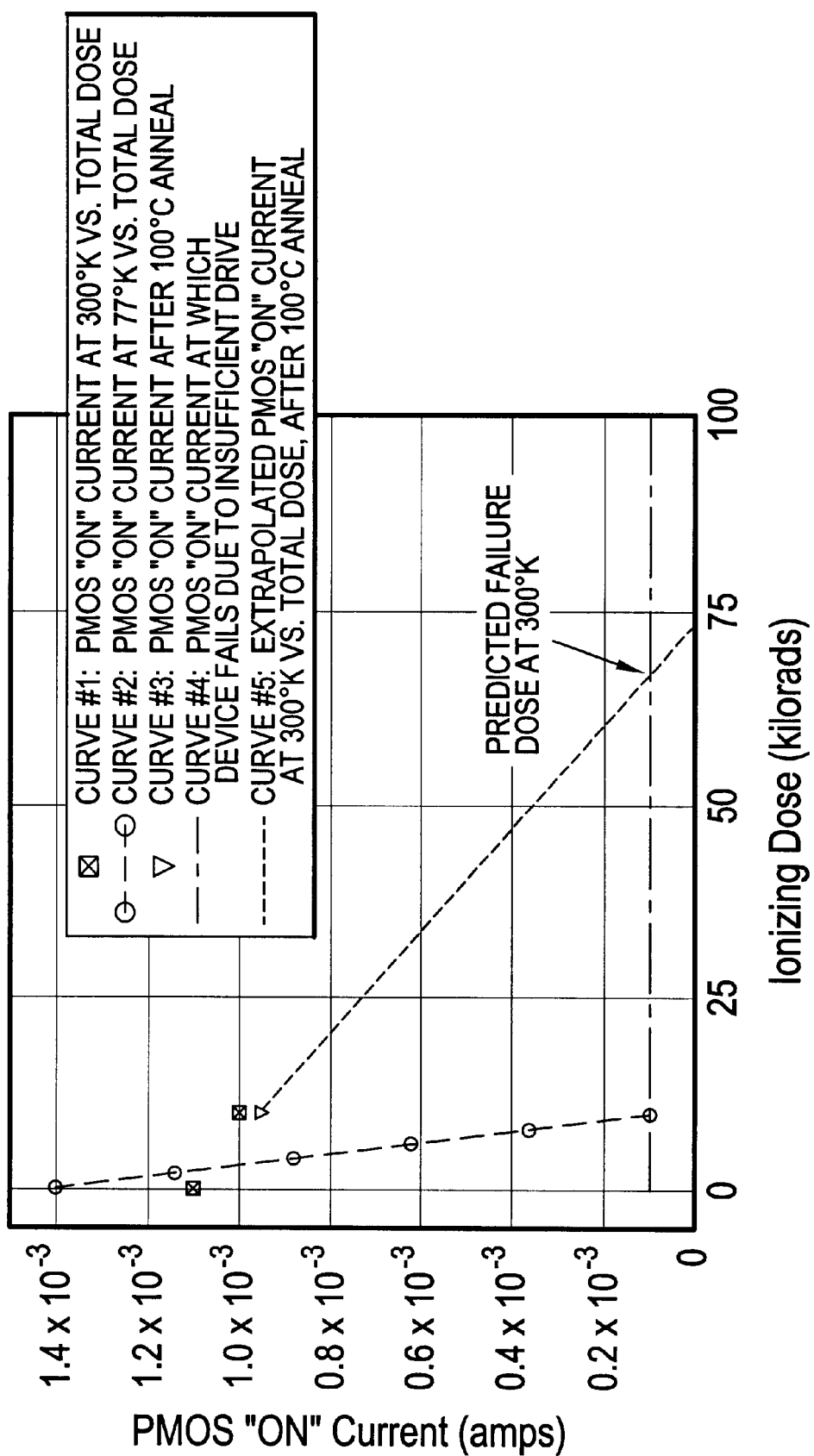
FIG. 12 is a graph of Monitor Parameter #4 (PMOS "ON" current with 100° C. anneal) vs. ionizing dose, in example Case #3 of the application of the invention.

Category II IC: PMOS "ON" Current as a Monitor Parameter with a 100° C. anneal FIG. 12 shows a graphical example of how this procedure would be implemented for a hypothetical category II device which suffered parametric failure due to radiation exposure. Using the procedure shown in FIG. 8, monitor parameter(s) are first identified. For this device, the "ON" current of the PMOS device in an output buffer was used as a monitor parameter. (Other monitor parameters can be used as well, but in this example, the behavior seen for the PMOS "ON" current will be examined in detail.) The "ON" current of the PMOS device in an output buffer determines the speed with which the output of a CMOS circuit can be driven from an "output low" state to an "output high" state. As oxide charge is accumulated due to ionizing dose, the threshold voltage of the PMOS device in the output buffer, $V_{TP}$, increases in magnitude, reducing the "ON" current which this device can supply. If interface states also form, $V_{TP}$ increases even more, further reducing the "ON" current. Eventually, this current becomes inadequate to permit the device to make this transition within the specified time, and the device fails parametrically. The dashed line at 0.1E-3 amps (Curve #3) in FIG. 11 is the value of PMOS "ON" current for which this occurs. Consequently, whenever the PMOS "ON" current reaches 0.1E-3 amps, the device will have suffered parametric failure.

To determine the ionizing dose at which this will occur at room temperature when interface traps are allowed for form, the DUT is first tested for this parameter at 300° K (Step 1 in FIG. 8) and at 77° K (Step 2). Points representing the values of the PMOS "ON" current at these temperatures are shown in FIG. 12 at zero ionizing dose. The DUT is then irradiated in increments of 2 Krads (Si) to a total dose of 10 Krads (Si) while retaining the device at cryogenic temperature, as indicated in Step 3 of FIG. 8. After each increment of ionizing dose, the PMOS "ON" current is measured and plotted in FIG. 12. (These points and the pre-radiation point measured at 77° K in Step 2, make up curve #2 of FIG. 12.) This data shows that at 10 Krads (Si), the PMOS "ON" current drops below the value at which the device would fail due to insufficient drive. If we assume that any radiation level that makes the PMOS "ON" current drop to a value of 0.1E-3 will result in parametric failure, this information can be used to predict the dose that would cause failure at room temperature.

The DUT is then warmed to 300° K, and the PMOS "ON" current measured at that temperature. This value is shown in FIG. 12 (1E-3 amps). The device is then annealed at 100° C. for 168 hours (Cf. Step 8 in FIG. 8), and then returned to room temperature (Step 9). The PMOS "ON" current is then re-measured, and is shown on FIG. 12 as 0.93E-3 amps. A curve (Curve #5 in FIG. 12) is then extrapolated from this point and the pre-rad value of the PMOS "ON" current, and the value of ionizing dose at which this extrapolated curve crosses Curve #4 (defined as the value of the PMOS "ON" current at which parametric failure occurs) is noted. This is predicted to be the dose at which this IC would fail if irradiated at low dose rate at 300° K.

While the foregoing generally and specifically describes the non-destructive radiation hardness testing methods of the present invention, the following claims are intended to define the scope of that invention.

What is claimed is:

1. A method for testing an IC device under test (DUT) for radiation hardness in a non-destructive manner, the method comprising the steps of:
   subjecting the DUT originally in an insensitized state, to a state in which the DUT is more sensitive to adverse effects of ionizing dose radiation;
   while the DUT is in the more sensitive state, subjecting the DUT to a low level of ionizing radiation sufficient to degrade performance of the DUT;
   electrically testing the degraded performance of the DUT;
   restoring the DUT to its original insensitized state; and
   relating the degraded performance of the DUT in its sensitized state to performance of the DUT that can be expected from it in its insensitized state.

2. The method of claim 1 wherein the subjecting the DUT to the low level of ionizing radiation produces an electrical failure of the DUT in response to an oxide charge build up in the DUT, and the relating of performance of the DUT comprises quantitatively relating the amount of oxide charge that causes the DUT failure to that which would cause DUT failure at the original state of the DUT.

3. The method of claim 1 further comprising:
   returning the DUT to the insensitized state:
   annealing the DUT for about 168 hours at about 100° C.; and
   again returning the DUT to its insensitized state; and
   wherein the relating of performance of the DUT in its insensitized state to performance of the DUT that can be expected in its insensitized state comprises quantitatively relating an amount of interface charge that causes the DUT failure to that which would cause DUT failure in the insensitized state of the DUT.

4. A method for testing an IC device under test (DUT) for radiation hardness in a non-destructive manner, comprising;
   measuring a monitor parameter for the DUT in an insensitized state;
   subjecting the DUT to a state in which the DUT is more sensitive to adverse effects of ionizing dose radiation;
   while the DUT is in the more sensitive state, subjecting the DUT to a low level of ionizing radiation sufficient to degrade performance of the DUT and to ultimately cause the DUT to fail;
   measuring the monitor parameter after the DUT is subjected to the low level of ionizing radiation;
   restoring the DUT to its original insensitized state;
   remeasuring the monitor parameter of the restored DUT; and
   utilizing the measurements of the monitor parameter in the insensitized and sensitized states to relate the degraded performance of the DUT in the sensitized state to performance of the DUT that can be expected from it in its insensitized state.

5. The method of claim 4 wherein the relating of the degraded performance of the DUT in its sensitized state to performance of the DUT that can be expected from it in its insensitized state includes calculating a radiation level at which the DUT would suffer a similar failure if radiated in its insensitized state.

6. The method of claim 5 wherein the step of subjecting the DUT to a state in which it is more sensitive comprises subjecting the DUT to a temperature of about 160° K or less.

7. The method of claim 5 wherein the measuring of the monitor parameter includes measuring a monitor current for the DUT in its insensitized and sensitized states.

8. The method of claim 7 wherein measuring the monitor current is followed by a functional testing of the DUT.

* * * * *